United States Patent
Kim

(10) Patent No.: US 7,719,072 B2
(45) Date of Patent: May 18, 2010

(54) IMAGE SENSOR AND METHOD FOR FABRICATING THE SAME

(75) Inventor: Sang Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1175 days.

(21) Appl. No.: 11/319,495

(22) Filed: Dec. 29, 2005

(65) Prior Publication Data

US 2006/0145277 A1 Jul. 6, 2006

(30) Foreign Application Priority Data

Dec. 30, 2004 (KR) .................. 10-2004-0116510

(51) Int. Cl.
*H01L 31/0232* (2006.01)

(52) U.S. Cl. ...................... 257/432; 257/440
(58) Field of Classification Search ............... None
See application file for complete search history.

(56) References Cited

U.S. PATENT DOCUMENTS

2004/0070039 A1* 4/2004 Sekine et al. ............... 257/428

FOREIGN PATENT DOCUMENTS

| CN | 1501169 A | | 6/2004 |
|---|---|---|---|
| CN | 1507066 A | | 6/2004 |
| KR | 2002-0052800 | * | 7/2002 |

OTHER PUBLICATIONS

Computer-generated translation of KR 2002-0052800 (Jul. 2002).*
Abstract of KR 2002-0052800 (Jul. 2002).*

* cited by examiner

*Primary Examiner*—John A. McPherson
(74) *Attorney, Agent, or Firm*—McKenna Long & Aldridge LLP

(57) ABSTRACT

The image sensor includes a semiconductor substrate, a first color filter pattern formed over the substrate, the first color filter pattern having an edge portion with a first slope, and a second color filter pattern formed next to the first color filter pattern, the second color filter pattern having an edge portion with a second slope.

5 Claims, 9 Drawing Sheets

IMAGE SENSOR AND METHOD FOR FABRICATING THE SAME

CROSS-REFERENCE TO RELATED APPLICATION

This application claims the benefit of cross-reference to related application Korean Patent Application No. P2004-116510, filed on Dec. 30, 2004, which is hereby incorporated by reference for all purposes as if fully set forth herein.

BACKGROUND OF THE INVENTION

1. Field of the Invention

The present invention relates to an image sensor, and more particularly, to an image sensor having a color filter with a slope interface and a method for fabricating the same in which the area of a condensing lens is maximized and a phase signal of uncondensed light is absorbed so as not to generate photoelectric conversion, thereby obtaining better resolution and photosensitivity.

2. Discussion of the Related Art

Generally, in fabricating an image sensor, the resolution is determined by the number of photodiodes existing in an image plane that receives images. Therefore, there is a trend in the industry toward a high number of pixels and miniaturization of the unit pixel in the image sensor. In condensing external images to the image plane, the size of the unit pixel is reduced and a light-receiving portion is reduced, thereby reducing photosensitivity. To enhance photosensitivity, a condensing lens can be used.

The condensing lens is formed below or on color filter layers. Since condensing efficiency of incident light depends on a sectional area of the condensing lens, the area of the condensing lens is maximized to condense more light Uncondensed light is reduced to reduce a phase signal, thereby obtaining images at a high resolution.

As described above, with the miniaturization and a multi-pixel structure of the image sensor, more pixels per unit area can be formed. With the decrease in pixel size, the sizes of color filter layers and a microlens layer formed in an on-chip mode also become smaller. As the size of unit pixel is reduced, a photodiode area that receives light is also reduced, thereby reducing photosensitivity. To compensate for reduced photosensitivity, an inner lens can be additionally formed. In this case, the inner lens induces the incident light to adapt to a variation of a the condensing angle due to F-number and compensates for stray light at an increased distance from the photodiode area. Alternatively, to compensate for reduced photosensitivity, the size of the microlens layer is maximized.

In addition, to compensate for any reduction in photosensitivity, the photodiode area should receive as much light as possible. To increase the amount of light received by the photodiode area, an opening can be increased and a condensing microlens can be formed. The opening is formed by a metal layer that serves as wiring and for light-shielding. In condensing the incident light entering the light-shielding layer through the unit pixel to the opening after refracting the light through the condensing lens, the adhesion between the condensing lenses is varied depending on the size of the condensing lens. For this reason, image uniformity is deteriorated. The condensing lens can be affected by the color filter layers in such that information between adjacent color filter layers is mixed, thereby deteriorating color reproduction and contrast. Moreover, it is difficult to form a precise pattern during alignment exposure due to poor optical resolution caused by the mixture of pigment when the color filter layers are formed. A planarization layer is additionally required because of the overlap or gap between the color filter layers.

FIGS. 1A to 1E are sectional views illustrating processes for fabricating a conventional image sensor.

Referring to FIG. 1A, photodiodes 12 are formed in a substrate 10, and metal layers 14 are formed over the substrate 10.

Referring to FIG. 1B, a planarization layer 20 is formed over the entire surface of the substrate, including the metal layers 14, to minimize any overlap or gap between the subsequently formed color filter patterns.

Referring to FIGS. 1C to 1E, the color filter patterns are formed on the planarization layer 20 by a photolithographic process to perform color filtering. In other words, the photolithographic process is performed three times to sequentially form the R/G/B color filter patterns.

FIGS. 2A to 2D are sectional views illustrating processes for forming the color filter patterns for conventional image sensor in more detail.

FIG. 2A illustrates a profile of a first color filter pattern 60 in a conventional image sensor. FIG. 2B illustrates a profile of second color filter layer 70 formed on the passivation layer 20, including the first color filter pattern 60. FIG. 2C illustrates a profile between the respective color filter patterns in the conventional image sensor. Referring to FIG. 2C, an overlap 80 is formed on the second filter pattern 70a adjacent to the first color filter pattern 60. FIG. 2D is a sectional view illustrating an overcoating layer 90 formed on the color filter patterns 60, 70 in the conventional image sensor.

When color filter patterns are formed by sequentially performing a photolithographic process three times, the profile of the first color filter pattern can play a role in determining the characteristics of the image sensor. Generally, a sidewall of a color filter pattern is formed in a negative pattern at an angle of 90° or greater. A step difference is formed at the edge of the first color filter pattern due to the surface topology when the second color filter pattern is formed. The second color filter pattern becomes thicker at the overlapped portion with the first color filter pattern due to the step difference. Moreover, the pattern profile of FIG. 2C is obtained by various process factors such as mask design during alignment exposure, wafer alignment, development, and other factors.

SUMMARY OF THE INVENTION

Accordingly, the present invention is directed to an image sensor and a method for fabricating the same, which can substantially obviate one or more problems that may be due to limitations and disadvantages of the related art.

The present invention provides an image sensor that maximizes the area of a condensing lens and absorb a phase signal of uncondensed light so as not to generate photoelectric conversion, thereby obtaining good resolution and photosensitivity.

The present invention also provides a method for fabricating an image sensor having color filter patterns with a slope interface therebetween, in which an area of a condensing lens is maximized and a phase signal of uncondensed light is absorbed so as not to generate photoelectric conversion, thereby obtaining good resolution and photosensitivity.

Additional advantages and features of the invention will be set forth in part in the description which follows and in part will become apparent to those having ordinary skill in the art upon examination of the following. These and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an image sensor comprising a semiconductor substrate, a first color filter pattern formed over the substrate, the first color filter pattern having an edge portion with a first slope, and a second color filter pattern formed next to the first color filter pattern, the second color filter pattern having an edge portion with a second slope.

The first color filter pattern can be engaged with the second color filter pattern to have a slope interface therewith. In this case, the slope interface can have a slope length less than two times of a length of a dead space of microlenses to be formed on the first and second color filter patterns.

The image sensor may further have a wedge shaped interface layer between the first and second color filter patterns. In this case, the wedge shaped layer can be formed of an organic material.

In another aspect of the present invention, there is provided a method for fabricating an image sensor comprising forming a first color filter layer over a substrate, and exposing the first color filter layer using a mask having an area smaller than a predetermined area for a first color filter pattern so that a predetermined slope is obtained at a side of the first color filter pattern.

The method can further comprise the steps of forming a second color filter layer on an entire surface of the substrate, including the first color filter pattern, and selectively exposing the second color filter layer to form a second color filter pattern.

The second color filter layer may be selectively exposed with a mask having an area smaller than a predetermined area for a second color filter pattern so that a predetermined slope is obtained at a side of the second color filter pattern and a wedge shaped space is formed between the first and second color filter patterns. In this case, the method can further comprise a step of filling the wedge shaped space with an organic material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and, illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

An image sensor according to the present invention can be formed on a silicon wafer by typical process steps of a CMOS or CCD. Color filter layers are formed in the image sensor to enable color filtering and color separation. Thus, the image sensor enables color recognition The image sensor is formed on the silicon wafer in a CCD or CMOS type by known process steps. A planarization layer is formed of an organic material having good transparency within a visible wavelength region. The planarization layer improves the profile and uniformity of the color filter patterns formed on an upper portion of the image sensor after it is passivated by a passivation layer.

The present invention can sequentially form three color filter patterns to prevent or reduce conventional problems with overlap or gap of the color filter patterns.

Figure 1A:
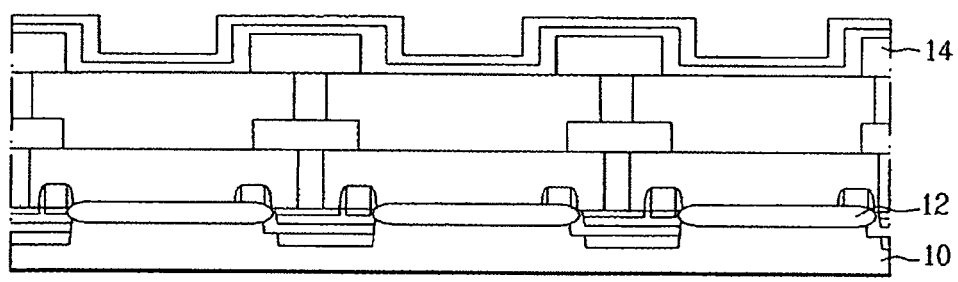
FIGS. 1A to 1E are sectional views illustrating processes for fabricating a conventional image sensor.
Figure 1B:
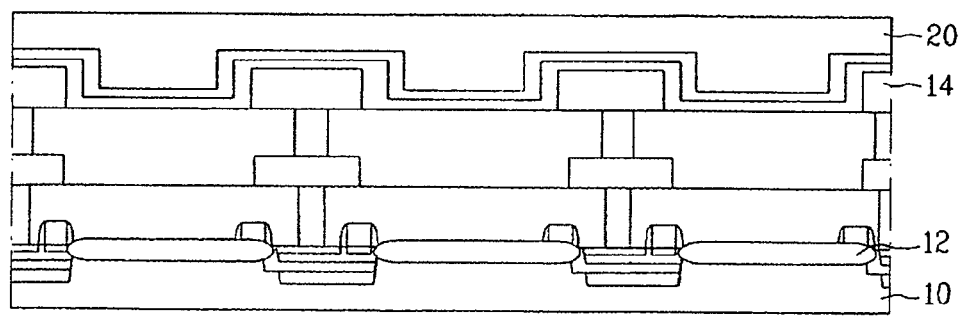
Figure 1C:
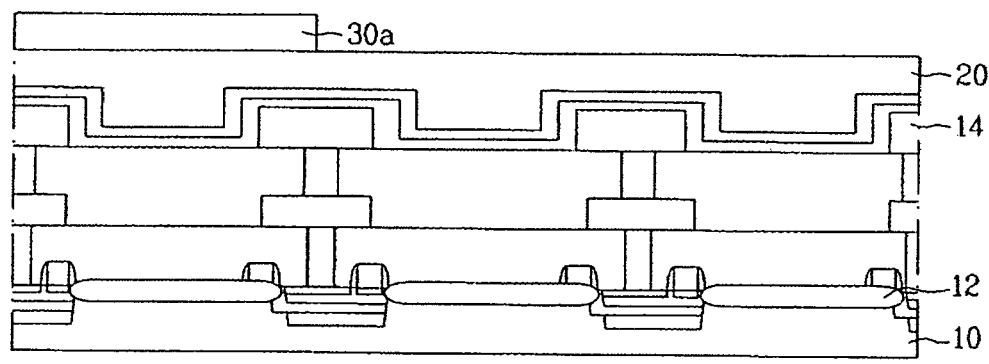
Figure 1D:
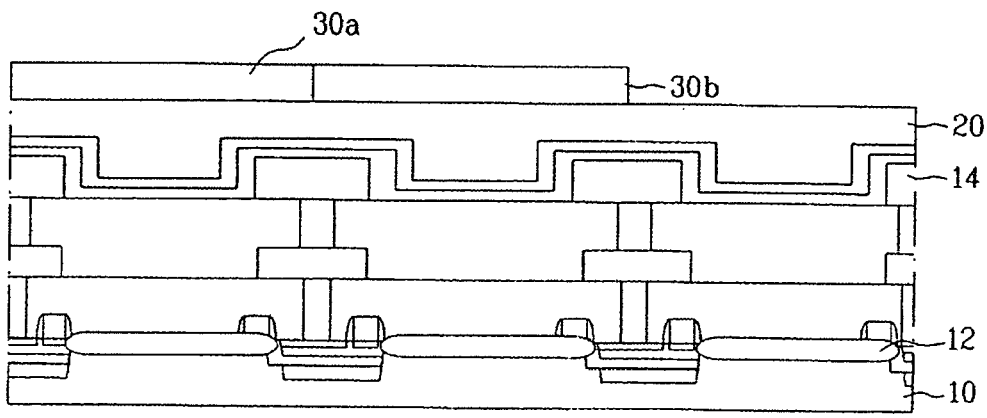
Figure 1E:
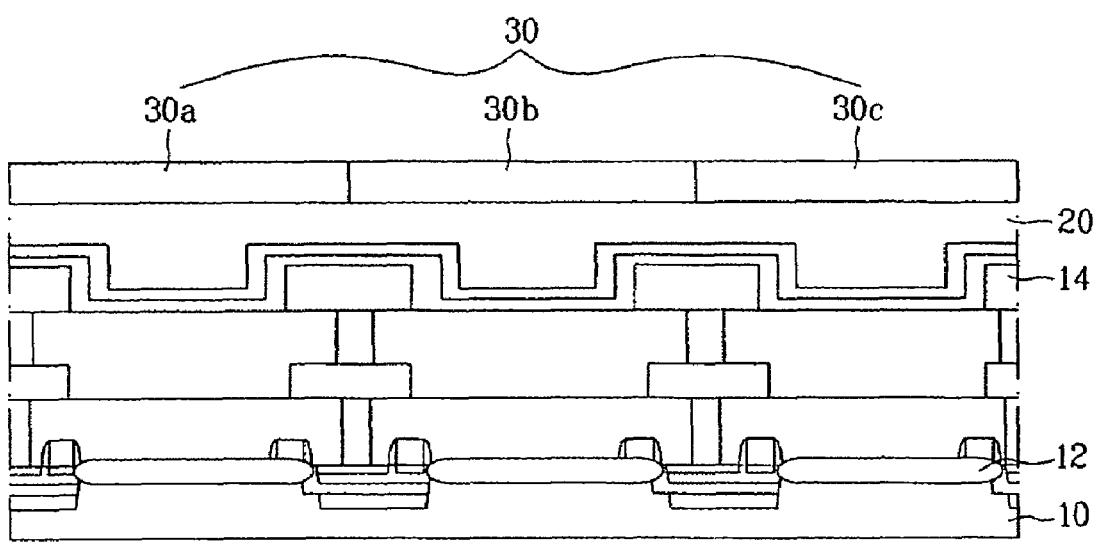
Figure 2A:
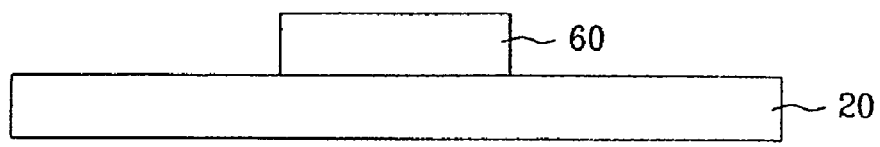
FIGS. 2A to 2D are sectional views illustrating processes for forming color filter layers for a conventional image sensor according to a related art.
Figure 2B:
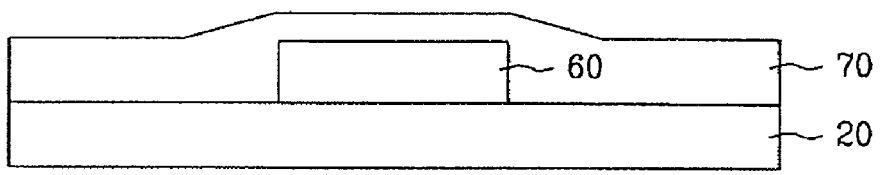
Figure 2C:
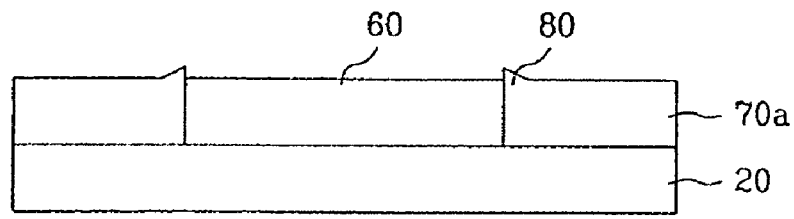
Figure 2D:
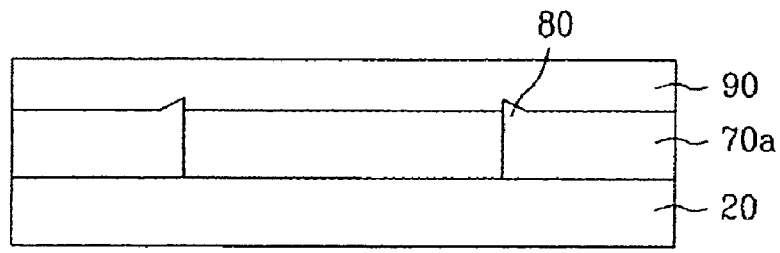
Figure 3:
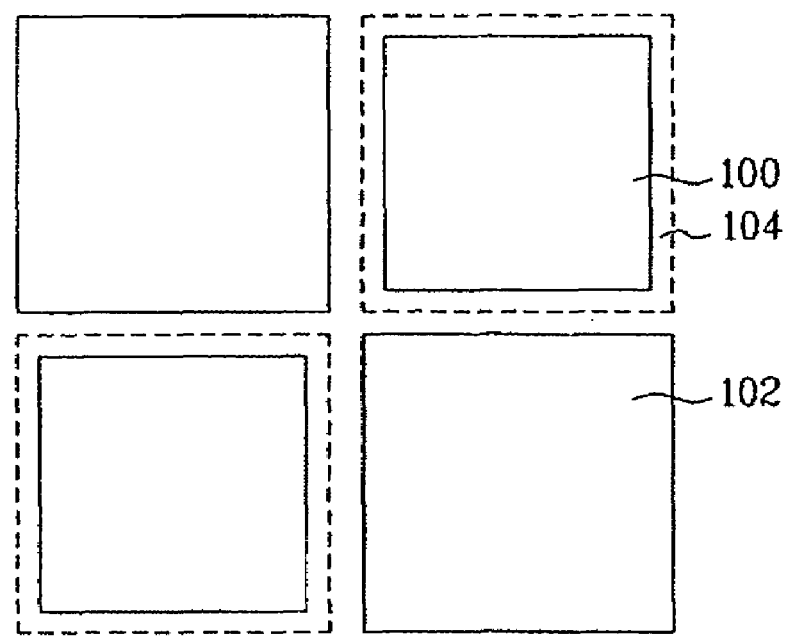
FIG. 3 illustrates an exemplary size of a mask according to the present invention.
Figure 4A:
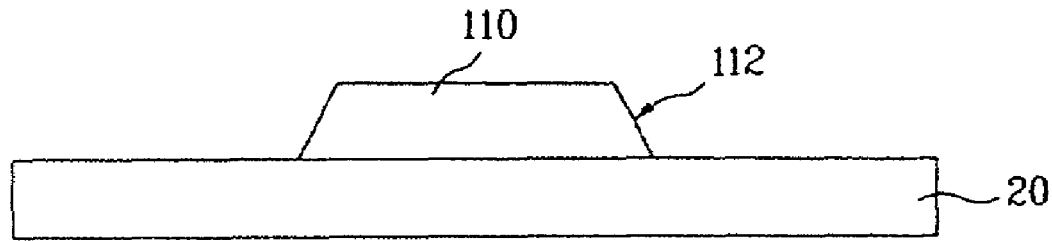
FIGS. 4A to 4C are sectional views illustrating an exemplary process for forming color filter layers for an image sensor according to the present invention.

Referring to FIG. 3 and FIG. 4A, if a green color filter pattern 110 is formed first, a first color mask 100 is designed to have a size smaller than that of other color masks 102 so that a margin 104 is formed to generate a relatively high amount of exposure energy during an exposure process. Thus, the sidewall of the first color filter pattern 110 has a positive slope 112 after exposure and development processes.

The first color mask 100 for the color filter layer is smaller than the other color mask 102 to obtain a margin 104. The positive slope 112 is formed at a side of the first color filter layer 110 by the exposure process. Thus, in performing a photolithography process, the processability index increases in terms of alignment margin, exposure, or mask drawing.

Figure 4B:
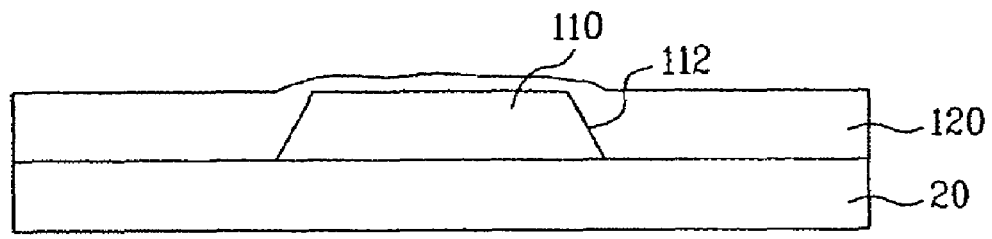
Figure 4C:
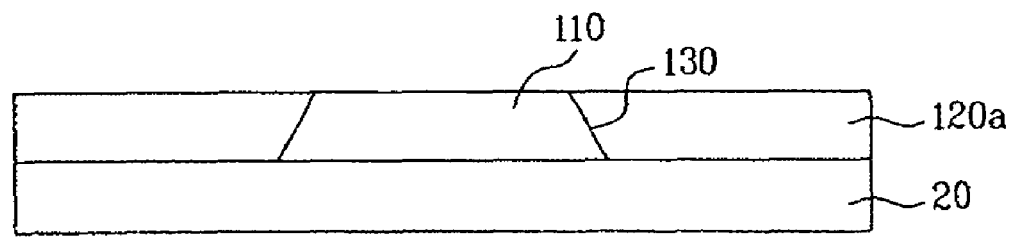

Referring to FIGS. 4B and 4C, a second color filter layer 120 is coated on the entire surface of the passivation layer 20, including the first color filter pattern 110. The second color filter layer 120 is not thickly coated on the edge of the first color filter pattern 110 due to the positive slope 112 of the first color filter pattern 110.

The second color filter layer 120 is then selectively exposed using a mask to form a second color filter pattern 120a. Alternatively, an etch back or CMP process may be performed on the second filter layer 120 until the upper surface of the first color filter pattern 110 is exposed, thereby forming a second color filter pattern 120a. Subsequently, the interface between the first and second color filter patterns 110, 120a has a slope 130.

The second color filter pattern 120a is formed to have the slope 130 by the pattern profile of the first color filter pattern 110. Thus, process margin increases in exposure and development processes. The interface of the first and second color filter patterns 110, 120a is formed without a step difference therebetween. A decoloring effect may be obtained at this interface portion resulting in a light-shielding effect.

Figure 5:
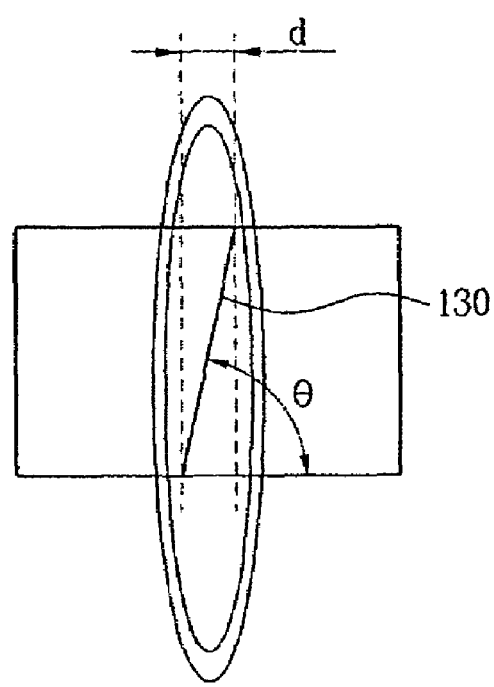
FIG. 5 is a detailed view illustrating an exemplary interface between first and second color filter patterns according to the present invention.

Referring to FIG. 5, the slope 130 is inclined at a predetermined angle of θ to have an overlap horizontal length of 'd' which represents the interface thickness between the first and second color filter patterns 110, 120a. The horizontal interface length may be formed at twice the dead space of the subsequently formed microlenses.

Figure 6:
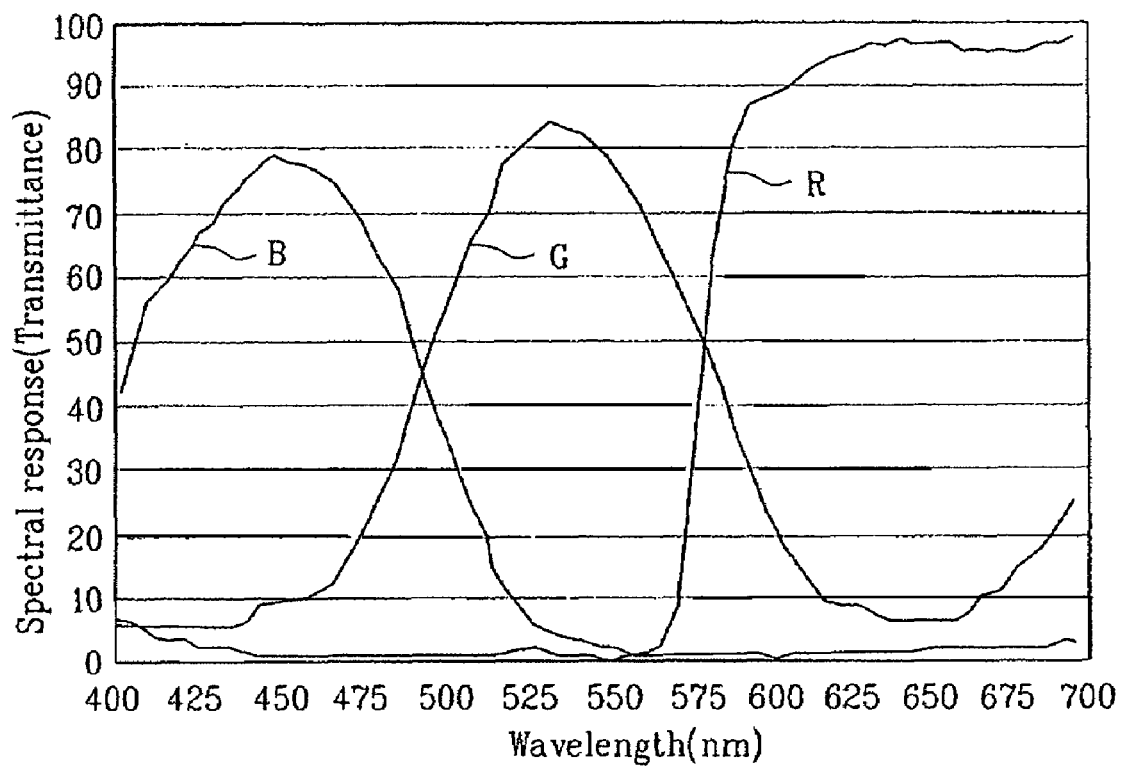
FIG. 6 is a spectrograph illustrating general primary colors.
Figure 7:
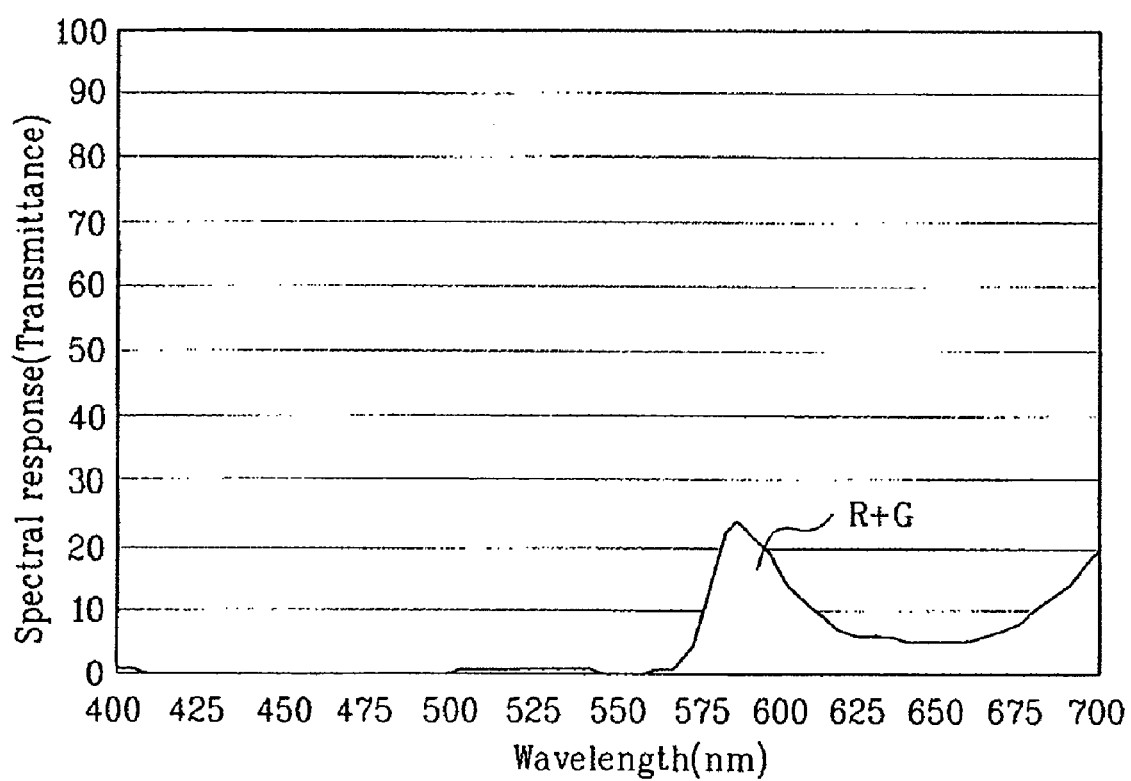
FIG. 7 is a spectrograph illustrating overlay G/R colors.

FIG. 6 is a spectrograph illustrating the general primary colors, and FIG. 7 is a spectrograph illustrating overlay G/R colors. As shown in FIGS. 6 and 7, an optical black effect can be improved by absorbing unclear color information at the interface between respective pixels. Thus, more exact and clear image information may be obtained.

Figure 8:
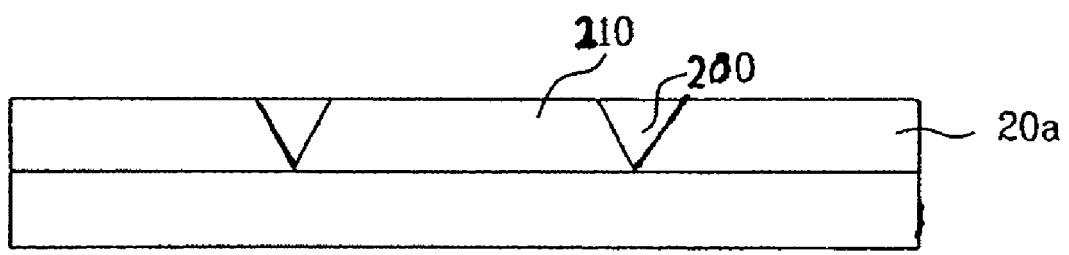
FIG. 8 is a sectional view illustrating an exemplary image sensor according to the present invention.

According to another embodiment of the present invention, as shown in FIG. 8, the second color filter pattern may be formed using a mask having an area smaller than a design area of the second color filter pattern. The second color filter layer can be exposed to become a second color filter pattern having a predetermined slope such that a wedge shaped space is formed at the interface between the first and second color filter patterns 210, 220a. Then, the wedge shaped space can be filled with an organic material 200. The same effects as mentioned above can be obtained.

Since the color filter patterns are formed to be planar by the above process, microlenses can be directly formed on the color filter layers without forming a separate overcoating layer.

As described above, in fabricating a color filter portion for the image sensor according to the present invention, the color filter layers can be stably and conveniently formed in each pixel to obtain clearer image.

In other words, in the present invention, a margin of a mask pattern for the color filter patterns increases enough to accommodate a fine pixel size. Overlap or gap between the respective color filter layers can efficiently be removed and a light-shielding effect can be obtained by absorbing unclear information at the interface. When the color filter layers are formed, an exposure process margin increases to improve productivity and quality.

An overcoating layer for additional planarization is not required since the color filter patterns are formed sufficiently planar. Therefore, process steps can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An image sensor comprising:
   a semiconductor substrate;
   a first color filter pattern formed on the substrate, the first color filter pattern having an edge portion with a first slope; and
   a second color filter pattern formed next to the first color filter pattern, the second color filter pattern having an edge portion with a second slope,
   wherein the first color filter pattern is engaged with the second color filter pattern to have a slope interface therewith, and the slope interface has a horizontal slope length less than twice a length of a dead space between microlenses subsequently formed on the first and second color filter patterns respectively.

2. The image sensor as claimed in claim 1, further comprising microlenses formed directly on the first and second color filter patterns.

3. The image sensor as claimed in claim 1, further comprising a wedge shaped interface layer between the first and second color filter patterns.

4. The image sensor as claimed in claim 3, wherein the wedge shaped interface layer is formed of an organic material.

5. The image sensor as claimed in claim 1, the first and second color filter patterns are formed with photoresist material.

* * * * *